United States Patent
Hackl et al.

(10) Patent No.: US 11,002,776 B2
(45) Date of Patent: May 11, 2021

(54) METHOD AND DEVICE FOR DETERMINING THE DIVISION OF A TOTAL INSULATION RESISTANCE AND THE DIVISION OF A TOTAL SYSTEM LEAKAGE CAPACITANCE IN AN UNGROUNDED POWER SUPPLY SYSTEM

(71) Applicant: BENDER GMBH & CO. KG, Gruenberg (DE)

(72) Inventors: Dieter Hackl, Fernwald (DE); Oliver Schaefer, Gruenberg (DE); Pascal Becker, Gruenberg (DE); Karl Schepp, Reiskirchen (DE)

(73) Assignee: BENDER GMBH & CO. KG, Gruenberg (DE)

( * ) Notice: Subject to any disclaimer, the term of this patent is extended or adjusted under 35 U.S.C. 154(b) by 99 days.

(21) Appl. No.: 16/511,350

(22) Filed: Jul. 15, 2019

(65) Prior Publication Data
US 2020/0025813 A1     Jan. 23, 2020

(30) Foreign Application Priority Data

Jul. 17, 2018  (DE) ..................... 10 2018 117 296.6

(51) Int. Cl.
*G01R 27/02*     (2006.01)
*G01R 27/26*     (2006.01)

(52) U.S. Cl.
CPC ......... *G01R 27/02* (2013.01); *G01R 27/2605* (2013.01)

(58) Field of Classification Search
CPC .... G01R 27/02; G01R 27/2605; G01R 31/52; G01R 19/0084; G01R 27/025
(Continued)

(56) References Cited

U.S. PATENT DOCUMENTS

| | | | |
|---|---|---|---|
| 2012/0126839 A1* | 5/2012 | Schaefer | G01R 27/18 324/750.01 |
| 2012/0206148 A1* | 8/2012 | Schaefer | G01R 27/18 324/509 |

(Continued)

FOREIGN PATENT DOCUMENTS

| | | | | |
|---|---|---|---|---|
| DE | 102014204038 A1 * | 9/2015 | | H02M 1/36 |
| DE | 102015008831 A1 * | 1/2017 | | G01R 31/007 |

OTHER PUBLICATIONS

"Isometer isoMIL425-D4W-4—Insulation monitoring device for unearthed IT AC—, AC/DC and DC systems (IT systems) in military applications up to 3(N)AC, AC/DC 400 V, Software version: D459 V1.xx"; Bender GmbH & Co. KG; pp. 19-36; Feb. 2015.

*Primary Examiner* — Tung X Nguyen
*Assistant Examiner* — Robert P Alejnikov, Jr.
(74) *Attorney, Agent, or Firm* — King & Schickli, PLLC

(57) ABSTRACT

A method and device for determining a division of a total insulation resistance and of a total system leakage capacitance in an ungrounded power supply system. The basic idea is to determine how the total insulation resistance is divided into partial insulation resistances and how the total system leakage capacitance is divided into partial system leakage capacitances between the active conductors of the ungrounded power supply system from displacement voltages measured between each of the active conductors of the ungrounded power supply system based on values determined in advance for the total insulation resistance and for the total system leakage capacitance of the ungrounded power supply system. By evaluating the displacement voltages in terms of their changes in amplitude, their frequency and their phasing, conclusions can be drawn as to the division of the total insulation resistance and of the total (Continued)

system leakage capacitance between the individual active conductors.

1 Claim, 4 Drawing Sheets

(58) Field of Classification Search
USPC .......................................................... 324/722
See application file for complete search history.

(56) References Cited

U.S. PATENT DOCUMENTS

| | | | |
|---|---|---|---|
| 2013/0082715 A1* | 4/2013 | Kawamura | G01R 27/18 324/509 |
| 2015/0255976 A1* | 9/2015 | Hackl | H02H 3/162 361/47 |
| 2017/0067953 A1* | 3/2017 | Hackl | G01R 31/14 |
| 2017/0307675 A1* | 10/2017 | Matsushita | G01R 31/50 |
| 2017/0315205 A1* | 11/2017 | Hackl | G01R 27/025 |

\* cited by examiner

METHOD AND DEVICE FOR DETERMINING THE DIVISION OF A TOTAL INSULATION RESISTANCE AND THE DIVISION OF A TOTAL SYSTEM LEAKAGE CAPACITANCE IN AN UNGROUNDED POWER SUPPLY SYSTEM

The disclosure of German Patent Application No. 10 2018 117 296.6, filed Jul. 17, 2018, is incorporated herein by reference.

TECHNICAL FIELD

The invention relates to a method for determining a division of a total insulation resistance and of a total system leakage capacitance in an ungrounded power supply system.

BACKGROUND

Furthermore, the invention relates to a device for implementing these methods.

When operational, fire and contact safety of electrical installations has to meet higher requirements, the system type of an ungrounded power supply system, which is also referred to as an isolated system (isolé terre—IT) or IT (power supply) system, is employed. In this kind of power supply system, the active parts are separated from the ground potential, i.e. from ground. The advantage of these systems is that in case of an insulation fault, such as a ground fault or a fault to frame, the function of the connected electrical loads is not affected because the ideally infinitely large impedance value between an active conductor of the system and ground prevents the formation of a closed circuit.

With this inherent safety of the ungrounded power supply system, a continuous power supply of the loads supplied by the ungrounded power supply system can be ensured even in the event of a first insulation fault.

Hence, the resistance of the ungrounded power supply system against ground (insulation resistance, in the fault case also referred to as an insulation fault resistance or fault resistance) is continuously monitored because a potential second fault on another active conductor would cause a fault loop, and the fault current flowing in that case in connection with an overcurrent protection device would result in a shutdown of the installation including a stop in operation.

Provided that the state of insulation of the ungrounded power supply system is continuously monitored by an insulation monitoring device, the ungrounded power supply system can continue to operate without a prescribed time limit even if a first fault has occurred.

Insulation monitoring devices are employed to monitor the insulation resistance. Insulation monitoring devices according to product standard IEC 61557-8, which are known from the state of the art, determine the insulation resistance of the entire IT system against ground. The insulation monitoring device is connected between the active conductors on one side and ground on the other side and superimposes a measuring voltage on the system. In the event of an insulation fault, the measuring circuit between the system and ground closes through the insulation fault, leading to a measuring current proportional to the insulation fault. This measuring current causes a corresponding voltage drop at a measuring resistor in the insulation monitoring device, the voltage drop being evaluated by the electronics and triggering an alarm if it exceeds a pre-settable threshold.

Insulation monitoring devices configured according to standards regard ohmic leakages divided symmetrically between all active conductors as insulation faults, just as they do insulation faults that occur asymmetrically, such as insulation faults occurring on a single active conductor.

In addition to determining the total insulation resistance, insulation monitoring devices available on the market offer the functionality of determining the total system leakage capacitance of the ungrounded power supply system against ground. Analogously to the total insulation resistance, which is the ohmic portion of the total system leakage impedance, the total system leakage capacitance constitutes the capacitive portion of the total system leakage impedance against ground. The total system leakage capacitance is the sum of all system leakage capacitances against ground, such as the capacitance per unit length of active conductors or noise suppression capacitors in the connected equipment.

However, there has been no satisfactory solution so far for the task of selectively determining the division of insulation resistance values and system leakage capacitance values for individual active conductors against ground. While the total insulation resistance and the total system leakage capacitance can be determined with the aid of the insulation monitoring devices, the determination of the division of the total insulation resistance and of the total system leakage capacitance between the individual active conductors proves problematic.

In ungrounded pure direct voltage systems, it is possible to draw a conclusion as to the division of the total insulation resistance between the active conductors and against ground by measuring a displacement voltage. Determination of the division of the total system leakage capacitance between the active conductors against ground has not been implemented so far in in insulation monitoring devices according to product standard IEC 61557-8.

In ungrounded single-phase or multi-phase alternating-voltage power supply systems, the division of the total insulation resistance cannot be determined by displacement voltage measurement alone because the displacement voltages also significantly depend on the magnitude and division of the system leakage capacitances between the active conductors against ground.

In ungrounded power supply systems, a symmetrical state of the ungrounded system against ground, a symmetrical load of the conductors and a minimization of protective conductor currents is often aimed at in order to minimize a strain on the electrical insulation and the electrical components against ground. In the majority of cases, this is taken into account during system planning and system set-up.

However, if changes are made to the ungrounded power supply system in the course of system operation or if aging or similar environmental conditions cause a shift in the symmetrical state toward asymmetrical states, early available information on this change is important in order to be able to initiate preventive maintenance measures. As a result of these changes, a symmetrical division of the total insulation resistance and of the total system leakage capacitance between the active conductors cannot be assumed.

Therefore, the object of the present invention is to propose a method and a device that are capable of determining the division of both the total insulation resistance and the total system leakage capacitance between the individual active conductors of an ungrounded direct-voltage or alternating-voltage power supply system.

With regard to the division of a total insulation resistance in an ungrounded power supply system comprising active conductors between which a conductor-conductor voltage occurs, this object is attained based on a prior determination of the total insulation resistance by the following method steps: measuring displacement voltages between each of the active conductors and ground, and determining a resistance division factor, which describes the division of the total insulation resistance into partial insulation resistances related to the active conductors, as a function of at least one of the parameters amplitude, frequency, phase of the displacement voltages measured.

SUMMARY

The basic idea of the present invention is to determine how the total insulation resistance is divided into partial insulation resistances between the active conductors of the ungrounded power supply system from measurements of displacement voltages between each of the active conductors of the ungrounded power supply system and ground based on a known value for the total insulation resistance of the ungrounded power supply system, which may have been determined by an insulation monitoring device prescribed by standards, for example.

A resistance division factor, which describes the division of the total insulation resistance, is determined from the displacement voltages measured, in particular from their amplitude curves over time and from frequency and/or phase measurements derived therefrom.

In an ungrounded DC power supply system, the resistance division factor is advantageously determined from the relation of the amplitudes of the displacement voltages.

Since there are no operation-related amplitude changes of the conductor-conductor voltage in a DC power supply system by nature, parasitically occurring changes in the conductor-conductor voltage are used. Hence, changes in the conductor-conductor voltages can be load changes, but other processes, such as a change of the source voltage or a discharge of a battery can also be used. If they occur abruptly, these changes over time of the conductor-conductor voltage lead to transient effects which are visible in the curves of the measured displacement voltages. Once the stationary state is reached, the resistance division factor, which indicates how the previously measured total insulation resistance is divided into partial insulation resistances between the active conductors, is determined from the relation of the amplitudes of the displacement voltages.

In another embodiment, the resistance division factor in an ungrounded single-phase or multi-phase AC power supply system is determined from the relation of the amplitudes of the displacement voltages, taking into account the frequency and the phasing of the displacement voltages.

The inherently present continuous changes in voltage in an alternating-voltage power supply system can be used to derive the information needed to determine the division of the total insulation resistance. Another change in voltage, such as due to a change in load, is not a necessary requirement, but can also be used advantageously. Since system leakage capacitances (imaginary part of the complex-valued system leakage impedance), which co-determine the value of the system leakage impedance, are unavoidable in a power supply system, the resistance division factor for the total insulation resistance (real part of the complex-valued system leakage impedance) is determined from the relation of the amplitudes of the displacement voltages, taking into account the frequency and the phasing of the displacement voltages.

A division of a total system leakage capacitance in an ungrounded power supply system comprising active conductors between which a conductor-conductor voltage occurs is determined in connection with a prior determination of the total system leakage capacitance in the following method steps: measuring displacement voltages between each of the active conductors and ground, and determining a capacitance division factor, which describes the division of the total system leakage capacitance into partial system leakage capacitances related to the active conductors, as a function of at least one of the parameters amplitude, frequency, phase of the displacement voltages measured.

Analogously to the basic idea in connection with the determination of the division of the total insulation resistance, the determination of the division of the total system leakage capacitance is also based on the idea that, first, displacement voltages between each of the active conductors of the ungrounded power supply system and ground are measured, and then, based on an evaluation of the amplitude curves over time, a capacitance division factor, which describes the division of the total system leakage capacitance, is determined from frequency and/or phase measurements derived therefrom.

In an ungrounded DC power supply system, the capacitance division factor is advantageously determined from the duration of a transient effect of the respective displacement voltage caused by the change in amplitude of the conductor-conductor voltage.

The change in amplitude of the conductor-conductor voltage caused by an external event, such as a switching process in the form of a load change, leads to an observable change in amplitude of the displacement voltage measurable on the respective active conductor. From the relation of the duration of the transient effects or their time constants, the capacitance division factor of the total system leakage capacitance into the partial system leakage capacitances of the respective active conductors can be determined.

In an ungrounded single-phase or multi-phase alternating-voltage power supply system, the capacitance division factor is advantageously determined from the relation of the amplitudes of the displacement voltages, taking into account the frequency and the phasing of the displacement voltages.

In an ungrounded single-phase or multi-phase alternating-voltage power supply system, the continuously changing amplitudes, the frequency and the phasing of the displacement voltages are evaluated, and the capacitance division factor for the division of the total system leakage capacitance into partial system leakage capacitances between the active conductors is determined therefrom.

With regard to a device for implementing a method for determining a division of a total insulation resistance and of a total system leakage capacitance in an ungrounded power supply system, the object is attained, based on a standard insulation monitoring device which serves to determine the total insulation resistance and which is configured for determining the total system leakage capacitance, by the device further comprising: signal inputs for measuring displacement voltages and signal processing units for determining a resistance division factor, which describes the division of the total insulation resistance into partial insulation resistances related to the active conductors, and for determining a capacitance division factor, which describes the division of the total system leakage capacitance into partial system leakage capacitances related to the active conductors.

Since the use of an insulation monitoring device is mandatory for insulation monitoring in ungrounded power supply systems, the insulation resistance value determined by the standard insulation monitoring device can be advantageously used to determine the division of said total insulation resistance into partial insulation resistances according to the invention.

Furthermore, the device comprises functional blocks for determining the total system leakage capacitance in order to determine the partial system leakage capacitances based on this determined system leakage capacitance according to the invention.

To this end, the enhanced insulation monitoring device has additional signal inputs at which the displacement voltages are registered.

For processing the registered displacement voltages, signal processing units for determining the respective division factor of the total insulation resistance and of the total system leakage capacitance are provided.

BRIEF DESCRIPTION OF THE DRAWINGS

Other advantageous embodiment features are apparent from the following description and from the drawing, which illustrates preferred embodiments of the invention using examples.

DETAILED DESCRIPTION

Figure 1:
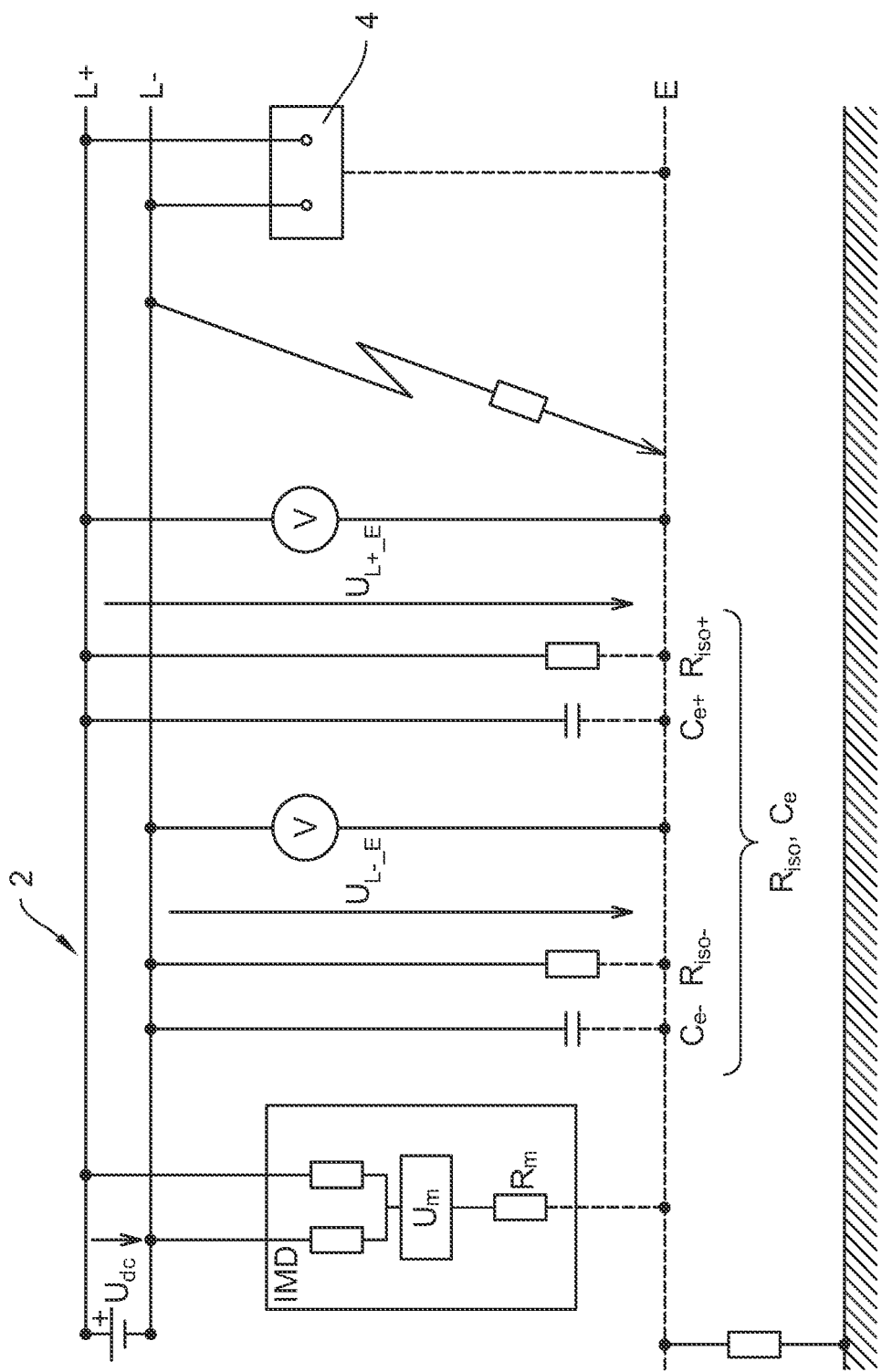
FIG. 1 shows an application of the method according to the invention in an ungrounded direct-voltage power supply system.

FIG. 1 shows an ungrounded DC power supply system 2 comprising two active conductors $L_+$ and $L_-$. DC power supply system 2 is fed by a voltage source $U_{dc}$, which supplies a load 4 connected between active conductors $L_+$ and $L_-$ with energy.

For monitoring the total insulation resistance $R_{iso}$ of ungrounded DC power supply system 2, an insulation monitoring device IMD which superimposes a measuring voltage $U_m$ on power supply system 2 is connected between conductors $L_+$, $L_-$ on one side and ground (ground potential) E on the other side. Via partial insulation resistances $R_{iso+}$, $R_{iso-}$, which are assigned to respective active conductors $L_+$, $L_-$ and act as leakage resistances, and via partial system leakage capacitances $C_{e+}$, $C_{e-}$ assigned to respective active conductors $L_+$, $L_-$, a measuring current $I_m$ occurs, which causes a corresponding voltage drop at a measuring resistor $R_m$ of insulation monitoring device IMD, said voltage drop being evaluated by insulation monitoring device IMD. Thus determined total insulation resistance $R_{iso}$ is the result of the parallel connection of partial insulation resistances $R_{iso+}$, $R_{iso-}$.

In order to be able to draw a conclusion as to the division of total insulation resistance $R_{iso}$ into partial insulation resistances $R_{iso+}$, $R_{iso-}$ assigned to respective active conductors $L_+$ and $L_-$, displacement voltages $U_{L+\_E}$ and $U_{L-\_E}$, which occur between active conductor $L_+$ and ground and between active conductor $L_-$ and ground E, respectively, are additionally measured.

Furthermore, a total system leakage capacitance $C_e$ is measured, which is the result of the parallel connection of partial leakage capacitances $C_{e+}$ and $C_{e-}$ assigned to respective active conductors $L_+$, $L_-$.

Figure 2:
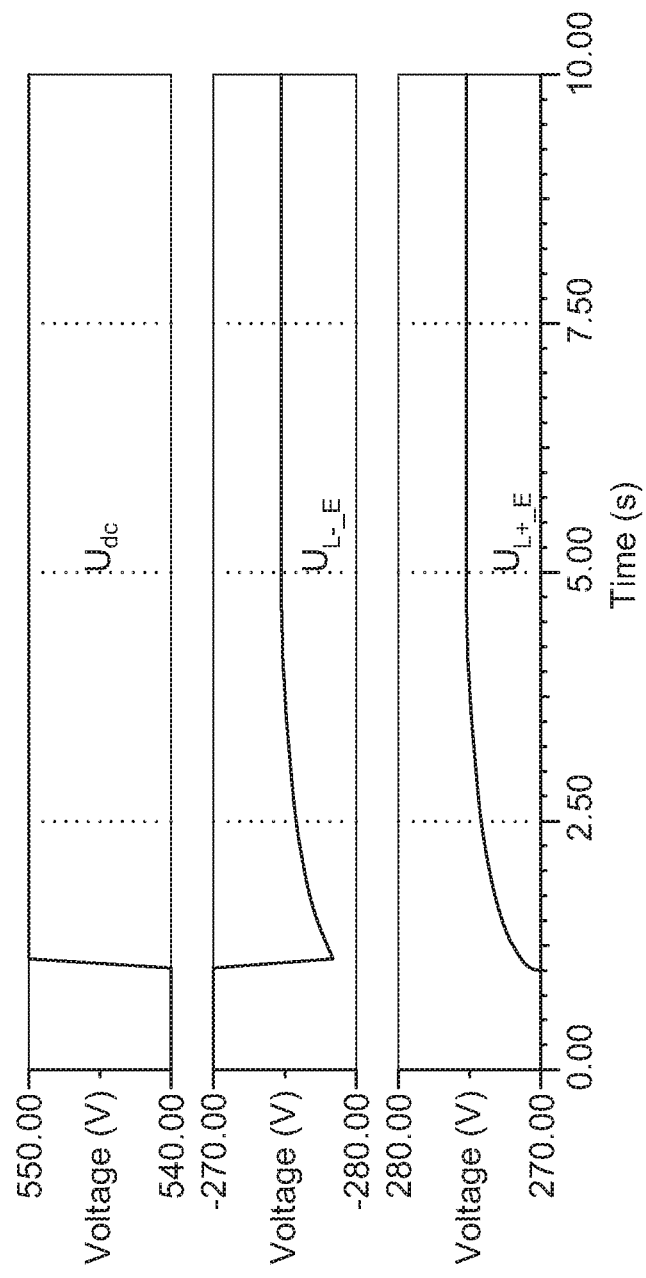
FIG. 2 shows measurements of the displacement voltages in the ungrounded direct-voltage power supply system illustrated in FIG. 1.

FIG. 2 shows measurements of displacement voltages $U_{L+\_E}$ and $U_{L-\_E}$, which occur in response to an abrupt change of conductor-conductor voltage (input voltage) $U_{dc}$.

With a voltage jump of 10 V from 540 V to 540 V, a mesh equation $U_{dc}=U_{L+\_E}-U_{L-\_E}$ results in the curves shown in FIG. 2 for displacement voltages $U_{L+\_E}$ and $U_{L-\_E}$. After termination of the transient effect, displacement voltages $U_{L+\_E}$ and $U_{L-\_E}$ each have the same absolute value of 275 V, which suggests a symmetrical division of determined total insulation resistance $R_{iso}$ into partial insulation resistances $R_{iso+}$, $R_{iso-}$.

The relation of the two final values of displacement voltages $U_{L+\_E}$ and $U_{L-\_E}$ at the two active conductors $L_+$, $L_-$ can be used directly to determine the relation of partial insulation resistance $R_{iso+}$ of active conductor $L_+$ to total insulation resistance $R_{iso}$ and thus determine resistance division factor $r_R$.

Generally, the following equations generally apply to an ungrounded DC power supply system comprising two active conductors:

$$R_{iso+} = r_R \times R_{iso} \text{ and } R_{iso} = \left(\frac{1}{r_R - 1} + 1\right) \times R_{iso}.$$

From the duration of a transient effect of respective displacement voltage $U_{L+\_E}$, $U_{L-\_E}$ caused by the change in amplitude of conductor-conductor voltage $U_{dc}$ and from the time constants obtained from the curve of the transient effects, capacitance division factor $r_c$ of partial system leakage capacitance $C_{e+}$ of active conductor $L_+$ to total system leakage capacitance $C_e$ of the power supply system can be obtained.

Consequently, the following applies to partial system leakage capacitances $C_{e+}$, $C_{e-}$: $C_{8+}=r_C \times C_8$ and $C_{8-}=(1-r_C) \times C_8$.

For example, with a resistance division factor $r_R$ of 25 and a determined total insulation resistance $R_{iso}$ of 19.2 KΩ, the above formulas render the division $R_{iso+}=480$ KΩ and $R_{iso-}=20$ KΩ.

In the same manner, a value of 0.25 for capacitance division factor $r_C$ and a determined total system leakage capacitance $C_e$ of 40 μF result in the division of $C_{e+}=10$ μF and $C_{e-}=30$ μF for the partial system leakage capacitances of active conductors $L_+$ and $L_-$.

Figure 3:
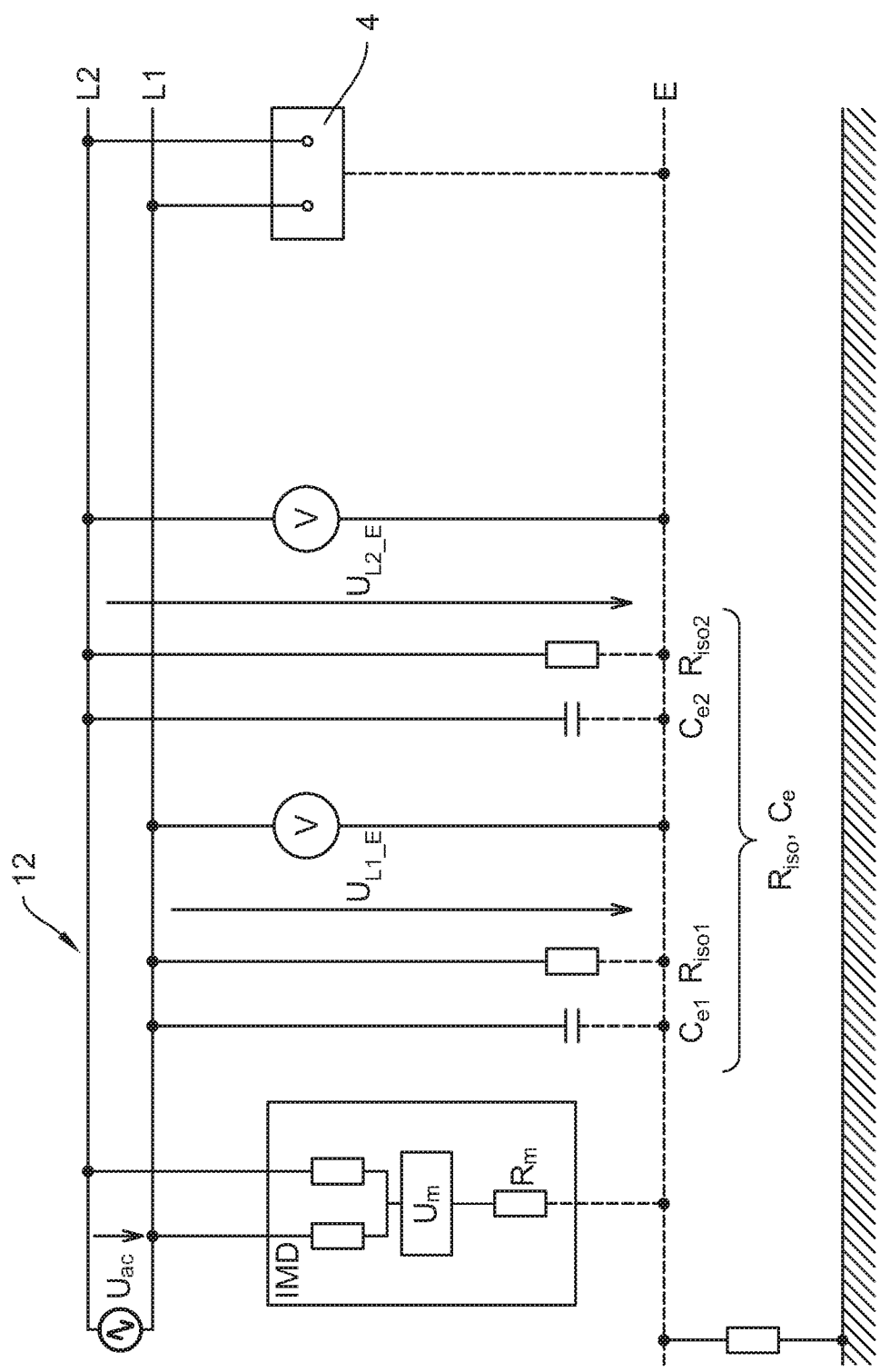
FIG. 3 shows an application of the method according to the invention in an ungrounded single-phase alternating-voltage power supply system.

FIG. 3 shows a single-phase alternating-current power supply system which has two active conductors $L_1$, $L_2$ and to which a load 4 is connected. Like in direct voltage power supply system 12 described in FIG. 1, insulation monitoring including determination of total insulation resistance $R_{iso}$ by an insulation monitoring device IMD takes place. Displacement voltages $U_{L1\_E}$ and $U_{L2\_E}$ are measured to be able to determine a division of total insulation resistance $R_{iso}$ into partial insulation resistances $R_{iso1}$, $R_{iso2}$ assigned to active conductors $L_1$, $L_2$ as per the invention.

Figure 4:
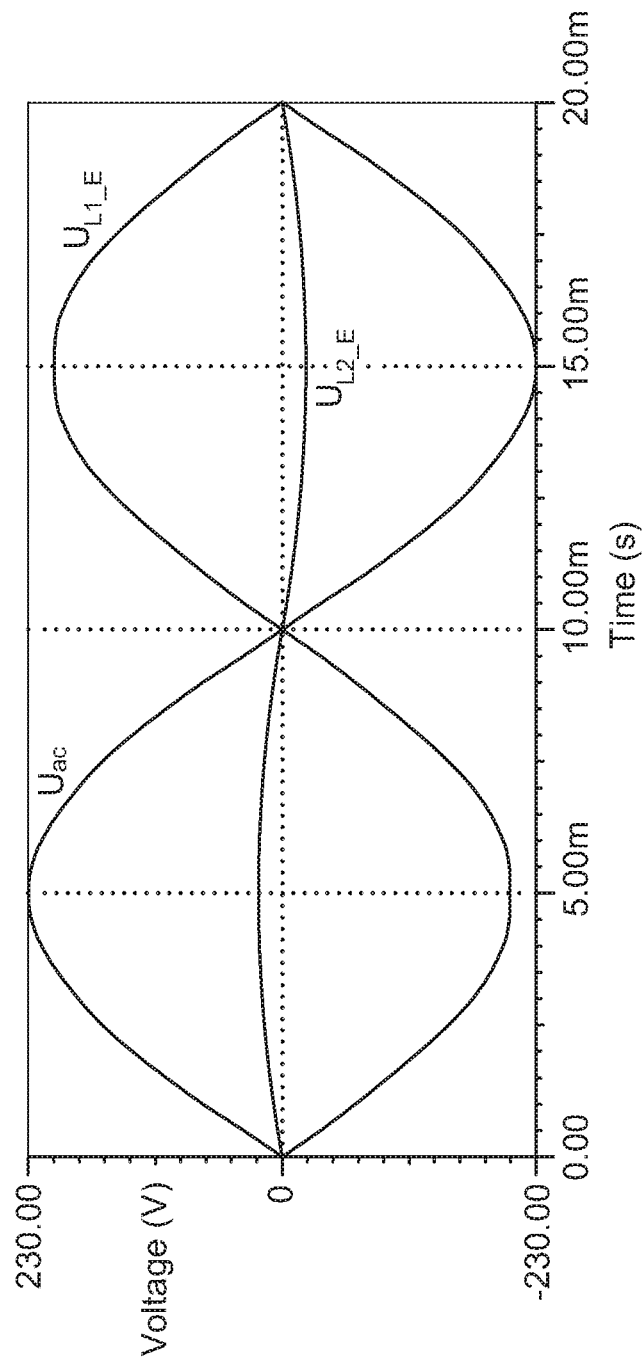
FIG. 4 shows measurements of the displacement voltages in the single-phase alternating-voltage power supply system illustrated in FIG. 3.

In FIG. 4, the curves over time of conductor-conductor voltage $U_{ac}$ (input voltage) and of displacement voltages $U_{L1\_E}$ and $U_{L2\_E}$ measurable at respective active conductors $L_1$, $L_2$ are illustrated.

Unlike in direct-voltage power supply system 2 described in FIG. 1, a change in conductor-conductor voltage $U_{ac}$ which is excited externally by a change in load, for example, is not required because conductor-conductor voltage $U_{ac}$ changes by nature (sinusoidally) in an alternating-voltage power supply system. Division factors $r_R$ and $r_C$ can be determined based on the changes in amplitude of measured displacement voltages $U_{L1\_E}$ and $U_{L2\_E}$ and based on the phase relation between displacement voltages $U_{L1\_E}$ and $U_{L2\_E}$.

Thus, the present invention advantageously exploits the fact that in addition to the common-mode measuring signal input by insulation monitoring device IMD to determine total insulation resistance $R_{iso}$, conductor-conductor voltages $U_{dc}$, $U_{ac}$, $U_{acxy}$ (indices x, y represent active conductors x, y) exhibit changes over time—which are caused by external events, such as load changes, or are present implicitly, like in alternating-voltage power supply systems—and effect the changes over time of registered displacement voltages $U_{L+\_E}$, $U_{L-\_E}$, $U_{Lx\_E}$.

By evaluating displacement voltages $U_{L+\_E}$, $U_{L-\_E}$, $U_{Lx\_E}$ in terms of their changes in amplitude, their frequency and their phasing, conclusions can be drawn as to the division of total insulation resistance $R_{iso}$ and of total system leakage capacitance $C_e$ between individual active conductors $L_+$, $L_-$, $L_x$.

Advantageously, no other highly precise current measurements are required. Likewise, there is no need for additional voltage-proof switches between active conductors $L_+$, $L_-$, $L_x$ and ground E, which would be needed to change a coupling impedance of insulation monitoring device IMD in order to be able to determine the division of total insulation resistance $R_{iso}$ or of total system leakage capacitance $C_e$.

The invention claimed is:

1. A method for determining a division of a total insulation resistance ($R_{iso}$) in an ungrounded power supply system (2, 12) comprising active conductors ($L_+$, $L_-$, $L_x$) between which a conductor-conductor voltage ($U_{dc}$, $U_{ac}$, $U_{acxy}$) occurs, the method comprising the method steps of:
   determining the total insulation resistance ($R_{iso}$) of the ungrounded power supply system (2, 12), characterized by
   measuring displacement voltages ($U_{L+\_E}$, $U_{L-\_E}$, $U_{Lx\_E}$) between each of the active conductors ($L_+$, $L_-$, $L_x$) and ground (E),
   determining a resistance division factor ($r_R$), which describes the division of the total insulation resistance ($R_{iso}$) into partial insulation resistances ($R_{iso+}$, $R_{iso-}$ $R_{isox}$) related to the active conductors ($L_+$, $L_-$, $L_x$), as a function of at least one of the parameters amplitude, frequency, phase of the displacement voltages ($U_{L+\_E}$, $U_{L-\_E}$, $U_{Lx\_E}$) measured,
   wherein the resistance division factor ($r_R$) is determined from the relation of the amplitudes of the displacement voltages ($U_{Lx\_E}$), taking into account the frequency and the phasing of the displacement voltages ($U_{Lx\_E}$).

* * * * *